(12) United States Patent
Shin et al.

(10) Patent No.: US 9,349,774 B2
(45) Date of Patent: May 24, 2016

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Min-Jae Shin, Gyeonggi-do (KR);
Jae-Wook Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 14/525,437

(22) Filed: Oct. 28, 2014

(65) Prior Publication Data
US 2015/0129853 A1 May 14, 2015

(30) Foreign Application Priority Data
Nov. 13, 2013 (KR) .................. 10-2013-0137645

(51) Int. Cl.
*H01L 27/32* (2006.01)
*G09G 3/32* (2016.01)

(52) U.S. Cl.
CPC ........ *H01L 27/3213* (2013.01); *H01L 27/3276* (2013.01); *G09G 3/3233* (2013.01); *G09G 2300/0426* (2013.01); *G09G 2300/0452* (2013.01); *G09G 2300/0819* (2013.01); *G09G 2320/0295* (2013.01); *G09G 2320/043* (2013.01)

(58) Field of Classification Search
CPC .................................................. H01L 27/3246
See application file for complete search history.

(56) References Cited

U.S. PATENT DOCUMENTS

2007/0139437 A1* 6/2007 Boroson .............. G09G 3/3225
345/590

* cited by examiner

*Primary Examiner* — Nimeshkumar Patel
*Assistant Examiner* — Jacob R Stern
(74) *Attorney, Agent, or Firm* — Morgan, Lewis & Bockius LLP (57) ABSTRACT

An organic light emitting diode display device includes a substrate including a display and non-display regions at a periphery of the display region with red, green, blue and white pixel regions as one pixel group formed in the display region, and the display region divided into a first region and a second region; an organic emitting diode in each of the red, green, blue and white pixel regions; first to third power lines respectively disposed at an end of the first region, at an opposite end of the second region and a boundary of the first and second regions and connected to the organic emitting diode; a first drive integrated circuit connected to the first and third power lines; and a second drive integrated circuit connected to the second and third power lines, wherein the first and second regions are symmetric with respect to the third power line.

4 Claims, 5 Drawing Sheets

ORGANIC LIGHT EMITTING DIODE DISPLAY DEVICE AND METHOD OF FABRICATING THE SAME

The present application claims the benefit of Korean Patent Application No. 10-2013-0137645, filed in Korea on Nov. 13, 2013, which is hereby incorporated by reference.

BACKGROUND OF THE INVENTION

1. Field of the Invention

The present invention relates to an organic light emitting diode (OLED) display device, and more particularly, to an OLED display device having high aperture ratio and high resolution and a method of fabricating the same with low production costs.

2. Discussion of the Related Art

As the society has entered in earnest upon an information age, a field of display devices that represent all sorts of electrical signals as visual images has developed rapidly. Particularly, the liquid crystal display (LCD) device or the OELD device as a flat panel display device having characteristics of light weight, thinness and low power consumption is developed.

The LCD device uses optical anisotropy and polarization properties of liquid crystal molecules. The LCD device is adequate to display moving images and has high contrast ratio.

The LCD devices require a liquid crystal panel including first and second substrates and a liquid crystal layer interposed therebetween. An arrangement of the liquid crystal molecules in the liquid crystal layer is changed by an electric field induced in the liquid crystal panel to control light transmissivity.

Generally, an additional light source is required because the liquid crystal panel is a non-emissive-type display device. Accordingly, a backlight unit is disposed under the liquid crystal panel. The LCD device displays images using light produced by the backlight unit and supplied to the liquid crystal panel.

On the other hand, the OLED display device is a self-emission type display device such that the backlight unit as a light source is not required. As a result, there are advantages in the fabricating process and thinness in the OLED display device.

In addition, the OLED display device has advantages in a viewing angle, a contrast ratio, a response time, power consumption in comparison to the LCD device. Moreover, since the elements of the OLED display device are solid, the OLED display device has high impact-resistance. The OLED display device for a high resolution and a large size is widely researched.

Figure 1:
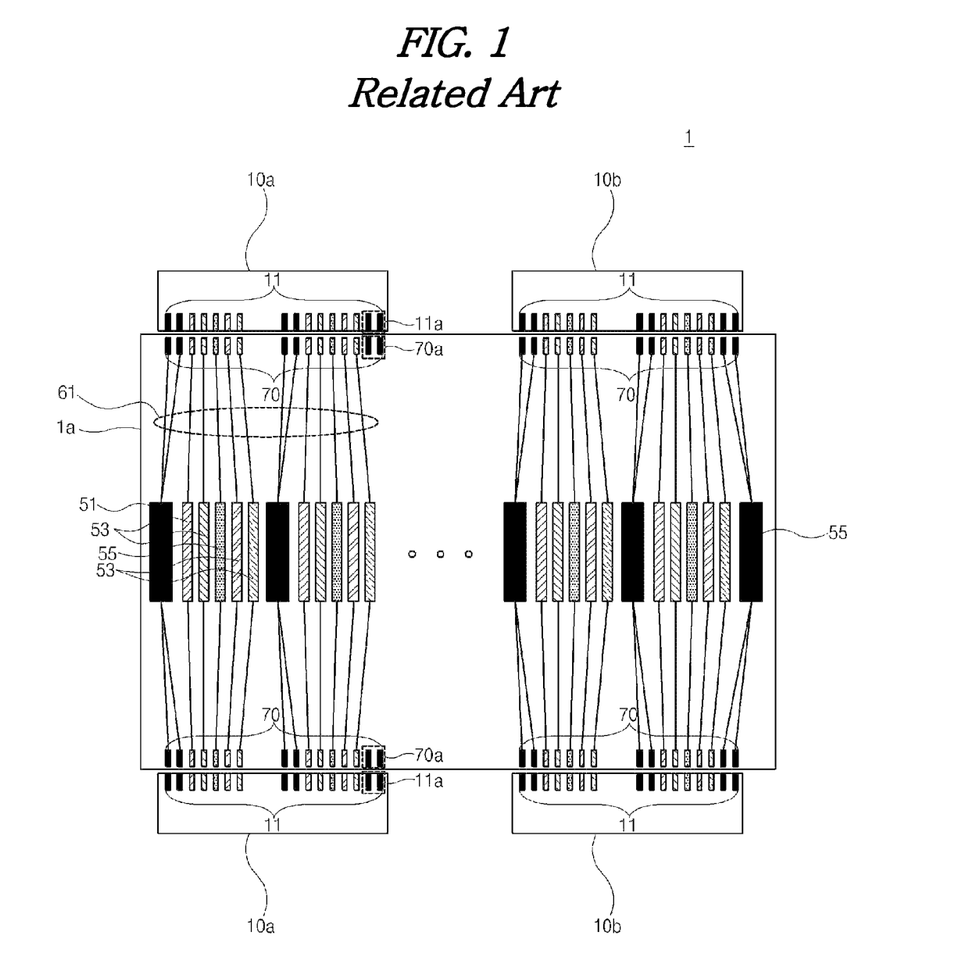
FIG. 1 is a plane view of the related art OLED display device.

FIG. 1 is a plane view of the related art OLED display device.

As shown in FIG. 1, on a substrate 1a of the OLED display device 1, a plurality of power lines 51, a plurality of data lines 53 and a plurality of reference voltage lines 55 are formed. At an edge of the substrate 1a, a plurality of pads 70, which are connected to the power lines 51, the data lines 53 and the reference voltage lines 55 through link lines 61, are formed.

A drive integrated circuit (IC) are installed at the edge of the substrate 1a, and first and second chip on films (COFs) 10a and 10b, each of which includes a plurality of pads 11, are connected to the drive IC. Each of the plurality of pads 70 formed at an upper edge of the substrate 1a is connected to each of the plurality of pads 11 formed at the first and second COFs 10a and 10b. The connection between the pads 70 and the pads 11 is conducted by a conductive adhesive such as an activated carbon fiber (ACF) including conductive balls.

The first and second COFs 10a and 10b are attached to a lower edge of the substrate 1a. The first and second COFs 10a and 10b at the lower edge overlap the first and second COFs 10a and 10b at the upper edge by 180 degree rotation.

As shown in FIG. 1, one power line 51, two data lines 53, one reference voltage line 55 and two data lines 53 are arranged from a side, i.e., a left side, of the substrate 1a as a line group. In addition, another one power line 51 is arranged at an end of a right side.

With the above line arrangement, a first dummy pad 11a is formed at an end of the right side of each of the COFs 10a and 10b. In addition, a second dummy pad 70a is formed at the substrate 1a to correspond to the first dummy pad 11a. Namely, the line arrangement is asymmetric such that the first and second dummy pads 11a and 70a are not connected to the power line 51. In addition, a design of a driving printed circuit board, which is connected to the COFs 10a and 10b, becomes difficult because of the first dummy pad 11a in the COF 10a.

The OLED display device is fabricated by a mask process for forming thin films by patterning a material layer. The mask process includes a step of forming a photoresist layer, a step of exposing the photoresist layer using an exposing mask, a step of developing the exposed photoresist layer to form a photoresist pattern, a step of etching the material layer using the photoresist pattern as an etching mask, and a step of removing the photoresist pattern.

In the large size substrate 1a, a stitching exposure is performed with respect to a boundary between the first and second COFs 10a and 10b. However, when the large size OLED display device is fabricated by the stitching exposure, there is a stain problem, i.e., a stitch defect, at the boundary between the first and second COFs 10a and 10b.

SUMMARY OF THE INVENTION

Accordingly, the present invention is directed to an OLED display device and a method of fabricating the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device comprises a substrate including a display region and a non-display region at a periphery of the display region with red, green, blue and white pixel regions as one pixel group formed in the display region, and the display region divided into a first region and a second region; an organic emitting diode in each of the red, green, blue and white pixel regions; first to third power lines respectively disposed at an end of the first region, at an opposite end of the second region and a boundary of the first and second regions and connected to the organic emitting diode; a first drive integrated circuit connected to the first and third power lines; and a second drive integrated circuit connected to the second and third power lines, wherein the first and second regions are symmetric with respect to the third power line.

In another aspect, a method of fabricating an organic light emitting diode display device, which includes a substrate, which includes a display region and a non-display region at a periphery of the display region, wherein red, green, blue and white pixel regions as one pixel group are formed in the display region, and the display region is divided into a first shot region and a second shot region; an organic emitting diode in each of the red, green, blue and white pixel regions; first to third power lines respectively disposed at an end of the first shot region, at an opposite end of the second shot region and a boundary of the first and second shot regions and connected to the organic emitting diode; a first drive integrated circuit connected to the first and third power lines; and a second drive integrated circuit connected to the second and third power lines, comprises forming a metal layer on the substrate; forming a photoresist layer on the metal layer; disposing a first exposing mask over the photoresist layer in the first shot region; performing a first shot to the photoresist layer using the first exposing mask in the first shot region; disposing a second exposing mask over the photoresist layer in the second shot region and a first blade over the photoresist layer in the boundary of the first and second shot regions; performing a second shot to the photoresist layer using the second exposing mask in the second shot region and the first blade; developing the photoresist layer to form a photoresist pattern; and etching the metal layer to form the first to third power lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE
ILLUSTRATED EMBODIMENTS

Reference will now be made in detail to the preferred embodiments, examples of which are illustrated in the accompanying drawings.

Figure 2:
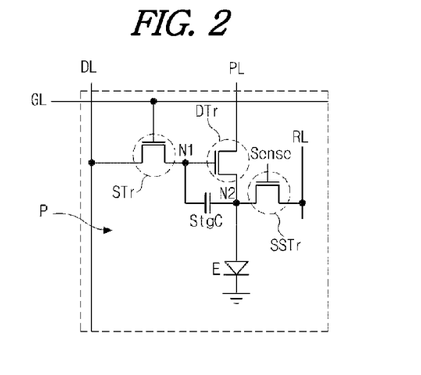
FIG. 2 is a circuit diagram of an OLED display device according to the present invention.

FIG. 2 is a circuit diagram of an OLED display device according to the present invention. The OLED display device of the present invention has high resolution and a large size. For example, the OLED display device may be a ultra high definition display device.

As shown in FIG. 2, an OLED display device 100 includes a switching thin film transistor (TFT) STr, a driving TFT DTr, a sensing TFT SSTr, a storage capacitor StgC and an organic emitting diode E in each pixel region P.

In addition, a gate line GL is formed along a first direction, and a data line DL, which crosses the gate line GL to define the pixel region P, is formed along a second direction. A sensing line (not shown) is formed to be separated from the gate line GL, and a power line PL is formed to be separated from the data line DL. A reference voltage line RL is formed to be separated from the data line DL and the power line PL. The reference voltage line PL is positioned at both edges of a substrate. Namely, the reference voltage line PL is positioned at outmost regions of the substrate.

The switching TFT STr is positioned at a crossing portion of the gate and data lines GL and DL, and the driving TFT DTr is electrically connected to the switching TFT STr. The sensing TFT SSTr is electrically connected to the driving TFT DTr.

A gate electrode of the switching TFT STr is connected to the gate line GL, and a source electrode and a drain electrode of the switching TFT STr is connected to the data line DL and the driving TFT DTr, respectively.

The switching TFT STr is turned on and turned off by a scan signal through the gate line GL and outputs a data signal, which is applied through the data line DL, when the switching TFT STr is turned on.

A source electrode and a drain electrode of the driving TFT DTr is connected to the power line PL and the organic emitting diode E, respectively. The storage capacitor StgC is formed between a first nod N1, which is between the drain electrode of the switching TFT STr and the gate electrode of the driving TFT DTr, and a second nod N2, which is between the drain electrode of the driving TFT DTr and the organic emitting diode E.

The storage capacitor StgC serves to maintain the voltage of the gate electrode of the driving TFT DTr when the switching TFT STr is turned off. Accordingly, even if the switching TFT STr is turned off, a level of an electric current applied from the power line PL to the emitting diode E is maintained to next frame.

A gate electrode of the sensing TFT SSTr is connected to the sensing line (not shown), and a source electrode of the sensing TFT SSTr is connected to the reference voltage line RL. A drain electrode of the sensing TFT SSTr is connected to the second nod N2.

The sensing TFT SSTr is turned on and turned off by a sense signal "Sense" through the sensing line, and the reference voltage line RL and the drain electrode of the driving TFT DTr is connected to each other when the sensing TFT SSTr is turned on. The sense signal is generated from a gate driving unit (not shown), and the gate driving unit further generates a plurality of signals including the scan signal.

The deviation of a threshold voltage (Vth) of the driving TFT DTr is sensed by the sensing TFT SSTr. The deviation is feed-backed into a control unit (not shown) and removed. As a result, a current level into the organic emitting diode E is constantly maintained such that the OLED display device provides images of uniform brightness.

The OLED display device according to the present invention includes three transistors and one capacitor in each pixel region P such that the current level to the organic emitting diode E is constantly maintained. Generally, a thermal degradation of the organic emitting diode is accelerated by an operation time such that the emission from the organic emitting diode is decreased. In this instance, the degree of the thermal degradation is not same in the pixel regions. In the present invention, by controlling the current level in each pixel region, the display quality of the OLED display device having high resolution and large size is improved.

Figure 3:
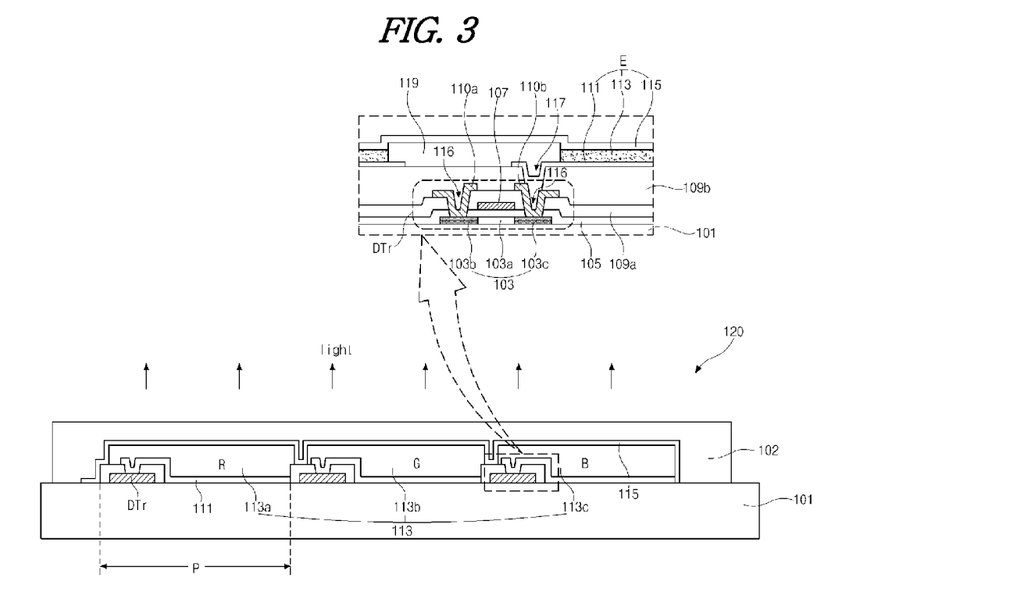
FIG. 3 is a cross-sectional view of a display panel for an OLED display device according to the present invention.

FIG. 3 is a cross-sectional view of a display panel for an OLED display device according to the present invention.

As shown in FIG. 3, a display panel 120 for an OLED display device includes a lower substrate 101, where the driving TFT DTr and the organic emitting diode E are formed, and an upper substrate 102 for encapsulation. The upper substrate 102 covers the organic emitting diode E and is attached to the lower substrate 101.

On the lower substrate 101, a semiconductor layer 103 is formed. The semiconductor layer 103 is formed of silicon. A center of the semiconductor layer 103 is defined as an active region 103a and serves as a channel. Impurities are doped into both sides of the semiconductor layer 103, and both sides of the semiconductor layer 103 are defined as a source region 103b and a drain region 103c, respectively. A gate insulating layer 105 is formed on the semiconductor layer 103.

A gate electrode 107 corresponding to the active region 103a of the semiconductor layer 103 is formed on the gate insulating layer 105.

A first interlayer insulating layer 109a is formed on the gate electrode 107. Semiconductor contact holes 116 are formed through the first interlayer insulating layer 109a and the gate insulating layer 105 to expose the source and drain regions 103b and 103c of the semiconductor layer 103.

A source electrode 110a and a drain electrode 110b, which are spaced apart from each other, are formed on the first interlayer insulating layer 109a. The source and drain electrodes 110a and 110b respectively contact the source and drain regions 103b and 103c through the semiconductor contact holes 116.

A second interlayer insulating layer 109b including a drain contact hole 117 is formed on the source and drain electrodes 110a and 110b. The drain electrode 110b is exposed through the drain contact hole 117.

The gate insulating layer 105 and the first and second interlayer insulating layers 109a and 109b may be formed of a transparent insulating material.

The source and drain electrodes 110a and 110b, the gate electrode 107, and the semiconductor layer 103 including the active region 103a and the source and drain regions 103b and 103c constitute the driving TFT DTr.

Although not shown, the switching TFT STr (of FIG. 2) is formed on the lower substrate 101. The gate line GL (of FIG. 2), which is connected to the gate electrode of the switching TFT STr, and the data line DL (of FIG. 2), which is connected to the source electrode of the switching TFT STr, are formed on the lower substrate 101. The gate line GL and the data line DL cross each other to define the pixel region P.

The semiconductor layer 103 is formed of poly-silicon, and the driving TFT DTr has a top gate structure. Alternatively, the semiconductor layer may be formed of amorphous silicon, and the driving TFT may have a bottom gate structure.

A first electrode 111 is formed on the second interlayer insulating layer 109b and is connected to the drain electrode 110b of the driving TFT DTr through the drain contact hole 117. The first electrode 111 is formed of a conductive material having a relatively high work function to serve as an anode. The first electrode 111 may be formed of a transparent conductive material such as indium-tin-oxide (ITO) or indium-zinc-oxide (IZO). The first electrode 111 is separately formed in each pixel region P, and a bank 119 is formed at edges of the first electrode 111. Namely, the bank 119 is formed at boundaries of the pixel region P and exposes a center of the first electrode 111.

An organic emitting layer 113 is formed on the first electrode 111. Namely, the organic emitting layer 113 contacts the center of the first electrode 111.

The organic emitting layer 113 may have a single-layered structure. Alternatively, to improve the emission efficiency, the organic emitting layer 113 may have a multi-layered structure of a hole injection layer, a hole transporting layer, an emitting material layer, an electron transporting layer and an electron injection layer.

The organic emitting layer 113 emits red light, green light and blue light. The organic emitting layer 113 may include red, green and blue organic emitting patterns 113a, 113b and 113c. In addition, there may be a white organic emitting pattern W (of FIG. 5) emitting white light.

A second electrode 115 is formed on the organic emitting layer 113. The second electrode 115 is formed of a conductive material having a relatively low work function to serve as a cathode. In addition, the second electrode 115 may include a semi-transparent metal layer having a relatively small thickness. The semi-transparent metal layer may be formed of magnesium-silver alloy (MgAg). The second electrode 115 may further include a transparent conductive material layer on the semi-transparent metal layer.

The first and second electrodes 111 and 115 and the organic emitting layer 113 therebetween constitute the organic emitting diode E.

The upper substrate 102 as an encapsulation substrate covers the organic emitting diode E. The upper substrate 102 may have a thin film. To prevent damages on the organic emitting diode E from oxygen or moisture, the upper substrate 102 may includes a plurality of inorganic material layers and a plurality of organic material layers. The inorganic material layers and the organic material layers are alternately stacked.

When pre-determined voltages are applied to the first and second electrodes 111 and 115, a hole from the first electrode 111 and an electron from the second electrode 115 are combined in the organic emitting layer 113 to form excitons. The excitons are transformed from an excited state into a ground state such that the display panel 120 generates the light. The display panel 120 is classified into a top emission type and a bottom emission type according to a direction of displaying images. In the top emission type display panel 120, the emitted light passes through the second electrode 115 such that the images are displayed in a direction of the upper substrate 102.

Figure 4:
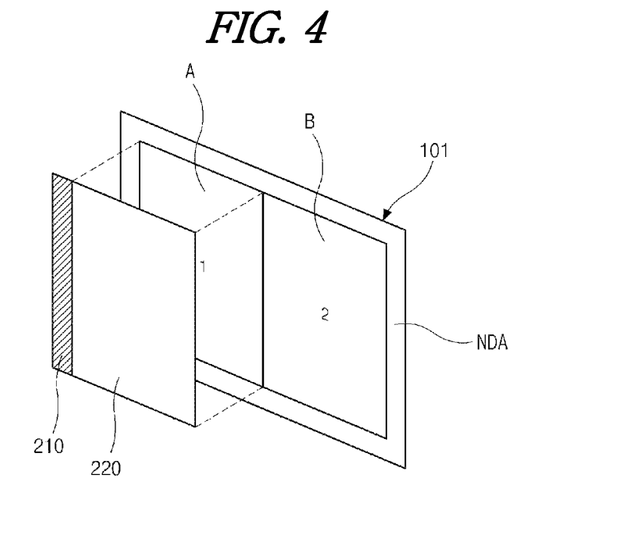
FIG. 4 is a view for illustrating an exposing method for fabricating an OLED display device according to the present invention.

FIG. 4 is a view for illustrating an exposing method for fabricating an OLED display device according to the present invention. One exposing step using an exposing mask is defined as a shot, and an exposed region in one shot is defined as a shot region.

Since the substrate 101 is larger than the exposing mask 220, the substrate 101 is divided into at least two shot regions. For example, the substrate 101 is divided into a first shot region "A" and a second shot region "B". The substrate 101 includes a display region DA (of FIG. 5) for displaying images and a non-display region NDA at a periphery of the display region DA. The display region DA is divided into the first shot region "A" and the second short region "B".

For example, when the gate electrode and the gate line are formed on the substrate 101, a metal layer for the gate electrode and the gate line is formed on the substrate 101 and a photoresist (PR) layer is formed on the metal layer. The exposing mask 220 is disposed over the PR layer, and the exposing process are sequentially performed in the first shot region "A" and the second shot region "B" to form a PR pattern. The metal layer is etched using the PR pattern to form the gate electrode and the gate line.

Although not shown, the exposing mask 220 includes a transmissive area and a blocking area. In addition, a blade 210 blocking undesired light is used with the exposing mask 220.

Figure 5:
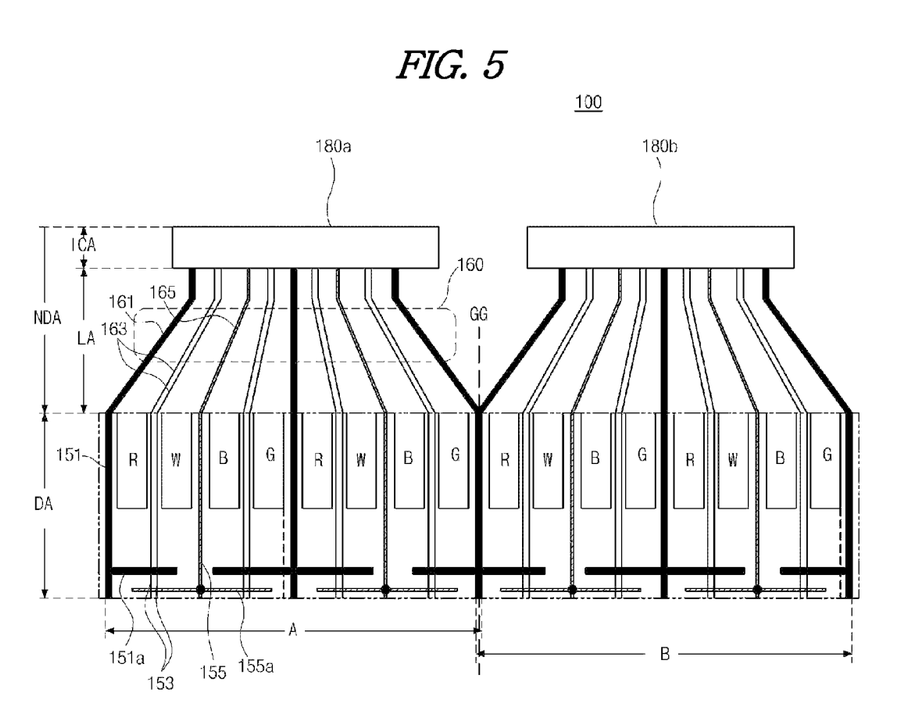
FIG. 5 is a plane view of an OLED display device according to the present invention.
Figure 6A:
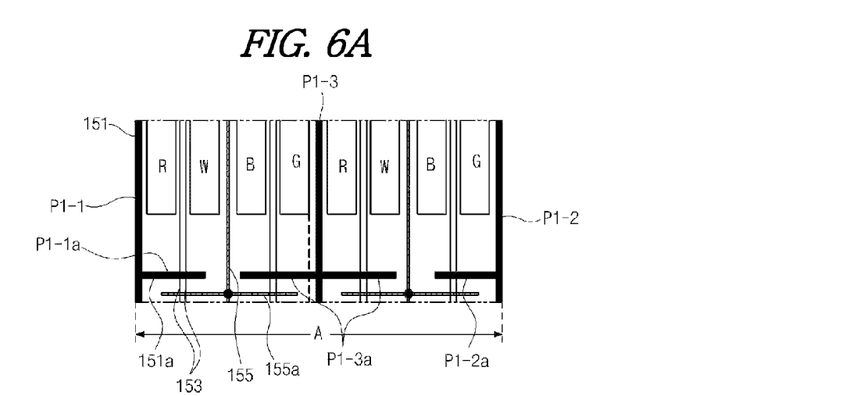
FIGS. 6A and 6B are plane views for illustrating steps of forming power lines for an OLED display device according to the present invention.
Figure 6B:
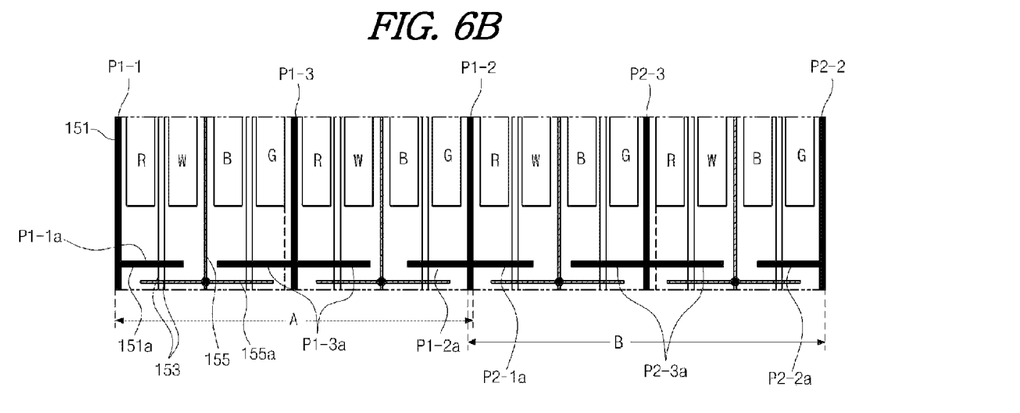

FIG. 5 is a plane view of an OLED display device according to the present invention, and FIGS. 6A and 6B are plane views for illustrating steps of forming power lines for an OLED display device according to the present invention.

As shown in FIG. 5, the substrate 101 (of FIG. 4) of the OLED display device 100 is divided into the display region DA and the non-display region NDA surrounding the display region DA. The display region DA is divided into the first shot region "A" and the second short region "B", and there is an overlapping region "GG" between the first shot region "A" and the second shot region "B".

In the display region DA, a plurality of pixel regions R, W, B and G are arranged along a first direction, i.e., a horizontal direction. The four pixel regions R, W, B and G are defined as a pixel group. A plurality of power lines 151 are formed along a second direction, i.e., a vertical direction, being perpendicular to the first direction. A plurality of data lines 153 and a plurality of reference voltage lines 155 are formed along the second direction to be spaced apart from the power lines 151.

Two of the power lines 151 are positioned at outmost portions of the substrate 101, the others of the power lines 151 are positioned between adjacent pixel groups. An auxiliary power line 151a extends from the power line 151 into the pixel regions of the pixel groups. For example, a part of the auxiliary power line 151a extends along a direction, i.e., a left direction, into two pixel region of one pixel group, and the other part of the auxiliary power line 151a extends along an opposite direction, i.e., a right direction, into two pixel region of another pixel group. As a result, a power from the power line 151 is applied to all pixel regions through the auxiliary power line 151a.

Similar to the power line 151, an auxiliary reference voltage line 155a extends from the reference voltage line 155 into the pixel regions of the pixel group. The reference voltage line 155 is positioned at a center of the pixel group.

The non-display region NDA includes a link region LA and a driver IC region ICA. In the link region LA, a link line 160 connecting respective lines in the display region DA to drive ICs 180a and 180b is formed. In more detail, the link line 160 includes a power link line 161 connecting the power line 151 to the first and second driver ICs 180a and 180b, a data link line 163 connecting the data line 153 to the first and second driver ICs 180a and 180b and a reference voltage link line 165 connecting the reference voltage line 155 to the first and second driver ICs 180a and 180b.

The driver IC region ICA is formed on an additional substrate. Alternatively, the driver ICs 180a and 180b are installed on a flexible film such that the drier ICs 180a and 180b as a chip on film (COF) connects a driving printed circuit board (not shown) to the substrate 101. Namely, the driver printed circuit board, which includes a timing controller, a power unit, and so on, is connected to the substrate 101 through the COF. For example, the first and second driver ICs 180a and 180b may be source driver IC.

In the OLED display device 100, the power line 151 is formed at the overlapping region "GG" as a boundary region between the first and second driver ICs 180a and 180b such that the first shot region "A" and the second shot region "B" is symmetric with respect to the power line 151. In addition, each of the first shot region "A" and the second shot region "B" has a symmetric structure with respect to a power line 151 at a center of each of the first shot region "A" and the second shot region "B". Accordingly, a design for the link lines and the pads in the driver ICs 180a and 180b becomes easier, and the stitch defect generated in the boundary between the first and second COFs 10a and 10b (of FIG. 1) is prevented.

As explained above, when the stitching exposure is performed on the substrate without the overlapping region "GG" and the power line 151 at the overlapping region "GG", there is the stitch defect such that the display quality of the OLED display device is degraded. In addition, the OLED display device has the asymmetric line arrangement in an entire region of the OLED display device or/and in each of the first and second shot regions "A" and "B", a design of the COFs and the driving printed circuit boards becomes difficult.

The first and second driver ICs 180a and 180b share the power line 151 at the overlapping region "GG". Namely, the power line 151 at the overlapping region "GG" is connected to the pad (not shown) in the first driver IC 180a as well as the second driver IC 180b. Accordingly, even if one power link line 161 for the power line 151 at the overlapping region "GG" is disconnected, there is no problem due to the other power link line 161.

FIG. 6A shows the first shot region "A", and FIG. 6B shows the second shot region "B" with the first shot region "A".

Referring to FIG. 6A, the exposing mask 220 (of FIG. 4) is disposed over a PR layer (not shown) on a metal layer (not shown) in the first shot region "A" of the substrate 101, and a first shot, i.e., a first exposing step, is performed. In this instance, the non-display region NDA and the second shot region "B" are blocked by the blade 210 (of FIG. 4).

Next, referring to FIG. 6B, the exposing mask 220 is disposed over a PR layer (not shown) on a metal layer (not shown) in the second shot region "B" of the substrate 101, and a second shot, i.e., a second exposing step, is performed. In this instance, the non-display region NDA, and the overlapping region "GG" and the first shot region "A" are blocked by the blade 210 (of FIG. 4).

The PR layer is developed to form a PR pattern, and the metal layer is etched using the PR pattern. As a result, the power lines P1-1, P1-2 and P1-3 are formed at the ends of the first shot region "A" and the center of the first shot region "A". The power lines P2-2 and P2-3 are formed at an end of the second shot region "B" and the center of the second shot region "B".

In addition, the data lines 153 and the reference voltage lines 155 are formed in the first shot region "A". Alternatively, the data lines 153 and the reference voltage lines 155 may be formed by different mask processes. Moreover, the auxiliary power lines P1-1a, P1-2a, P1-3a, P2-1a, P2-2a and P2-3a and the auxiliary reference voltage lines 155a may be formed with the power line 151 or by different mask processes.

By the above stitch exposing process, the first shot region "A" and the second shot region "B" have the symmetric arrangement with respect to the power line 151 at the overlapping region "GG" between the first and second driver ICs 180a and 180b such that the link lines 160 also have the symmetric arrangement. As a result, the driver ICs 180a and 180b as the COFs and the driving printed circuit boards have the symmetric arrangement.

As explained with FIG. 1, when the line arrangement in the display region is asymmetric, the internal pad or line arrangement in the COFs and the driving printed circuit boards has the asymmetric structure. In this instance, a design for the link lines and pads becomes very difficult or complicated such that the production costs of the OLED display device are increased and the production yield is decreased.

However, in the present invention, the line arrangement in the display region is symmetric with respect to the power line 151 at the overlapping region "GG", the driver ICs 180a and 180*b* (or the COFs) and the driving printed circuit board at an upper edge of the substrate 101 have the symmetric structure with the driver ICs 180*a* and 180*b* or the COFs and the driving printed circuit board at a lower edge of the substrate 101. As a result, the driver ICs 180*a* and 180*b* (or the COFs) and the driving printed circuit board having the same arrangement as those attached at the upper edge of the substrate 101 can be attached at the lower edge of the substrate 101 by 180 degrees rotation. Accordingly, the OLED display device of the present invention can be fabricated by the stitching exposure without the stitch defect and with the simple line design.

FIGS. 5 to 6B show the symmetric arrangement with respect to the power line. Alternatively, the OLED display device may have the symmetric arrangement with respect to the reference voltage line.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a substrate including a display region and a non-display region at a periphery of the display region including red, green, blue, and white pixel regions as one pixel group being formed in the display region, the display region being divided into a first region and a second region;
    a respective organic emitting diode in each of the red, green, blue, and white pixel regions;
    a power line connected to the organic emitting diodes and including first to third power lines respectively disposed at an end of the first region, at an opposite end of the second region, and at a boundary of the first and second regions;
    a first drive integrated circuit connected to the first and third power lines, and not connected to the second power line; and
    a second drive integrated circuit connected to the second and third power lines, and not connected to the first power line,
    wherein an arrangement of the power lines of the first and second regions is symmetric with respect to the third power line.

2. The organic light emitting diode display device according to claim 1, wherein the first and second drive integrated circuits share the third power line to have the same pad arrangement.

3. The organic light emitting diode display device according to claim 2, further comprising:
    first and second link lines at the non-display region and in the first region; and
    third and fourth link lines at the non-display region and in the second region,
    wherein the first and third link lines respectively connect the first and second power lines with the first and second drive integrated circuits, and
    wherein the second and fourth link lines respectively connect the third power line with the first and second drive integrated circuits.

4. The organic light emitting diode display device according to claim 1, further comprising:
    first and second auxiliary power lines oppositely extending from the third power line,
    wherein one power line is formed in one pixel group,
    wherein the first auxiliary power line extends into the red and white pixel regions, and
    wherein the second auxiliary power line extends into the green and blue pixel regions.

* * * * *